United States Patent [19]

Nakagawa et al.

[11] Patent Number: 5,168,253

[45] Date of Patent: Dec. 1, 1992

[54] HIGH FREQUENCY LADDER TYPE PIEZO-ELECTRIC FILTER WITH DIFFERENTLY POLED SERIES AND PARALLEL RESONATORS

[75] Inventors: Yasuhiko Nakagawa; Hisao Banno, both of Aichi, Japan

[73] Assignee: NGK Spark Plug Co., Ltd., Aichi, Japan

[21] Appl. No.: 705,030

[22] Filed: May 21, 1991

[30] Foreign Application Priority Data

May 21, 1990 [JP] Japan ................ 2-131066

[51] Int. Cl.$^5$ ............................................. H03H 9/205
[52] U.S. Cl. ................................ 333/189; 310/357; 310/366; 310/369
[58] Field of Search .................. 333/187-192; 310/320, 357, 359, 366, 369

[56] References Cited

U.S. PATENT DOCUMENTS 2,969,512  1/1961  Jaffe .................. 333/187
3,018,451  1/1962  Mattiat ............... 333/187

FOREIGN PATENT DOCUMENTS 212212  9/1988  Japan .................. 333/191

Primary Examiner—Eugene R. LaRoche
Assistant Examiner—Benny Lee
Attorney, Agent, or Firm—Finnegan, Henderson, Farabow, Garrett and Dunner

[57] ABSTRACT

A ladder type piezo-electric filter comprising series piezo-electric resonators and parallel piezo-electric resonators having improved second harmonic mode, high resonance response and anti-resonance impedance near 1-7 MHz, for use in communication applications requiring filter shaving resonator dimensions less than 5 mm and operating frequencies in excess of 455 kHz.

6 Claims, 4 Drawing Sheets

HIGH FREQUENCY LADDER TYPE PIEZO-ELECTRIC FILTER WITH DIFFERENTLY POLED SERIES AND PARALLEL RESONATORS

BACKGROUND OF THE INVENTION

1. Field of the Invention

This invention relates to a ladder type piezo-electric filter typically used as a filter circuit in a radio communication unit such as, for example, a portable radio communication unit or a mobile automobile telephone, and, more particularly, relates to a ladder type piezo-electric filter used in a high frequency band filter operating at frequencies higher than 1 MHz.

2. Discussion of the Related Art

Nearly all conventional ladder type piezo-electric filters used in the aforementioned radio communication applications operate at a response frequency of 455 KHz. In the conventional ladder type piezo-electric filter, as shown in FIG. 6 of the appended drawings, series piezo-electric resonators ($S_1$, $S_2$ and $S_3$) having a large thickness, a small capacitance, and a resonance frequency of 455 KHz are connected in a series/parallel ladder configuration with parallel piezo-electric resonators ($P_1$, $P_2$, and $P_3$) having a small thickness, a large capacitance and an anti-resonance frequency of 455 KHz.

A demand presently exists in radio communication units and mobile automobile telephone applications in particular for ladder type piezo-electric filters operating at a high frequency such as, for example, 1.7 MHz or 2 MHz. However, heretofore, it has not been practical to use conventional ladder type piezo-electric filters in these applications because the piezo-electric resonators making up the filter have dimensions in the order of 5 mm. 3 and a resonate frequency of 455 KHz. In contrast, the aforementioned applications require higher resonant frequencies and dimensions of 2 mm or less.

A conventional disk-shaped or rectangular-plate-shaped piezo-electric resonator, 5 mm in dimension and oscillating in a circumferential direction, typically provides a fundamental mode (FM) having a high resonance impedance near 500 KHz, and a second harmonic mode (SM) and a third harmonic mode (TM) as shown in FIGS. 7 and 8. FIG. 7 plots electrical impedance ($\Omega$) as a function of resonant frequency (kHz). FIG. 8 plots electrical charge ($+$or $-$) as a function of position measure in the circumferential direction on the surface of the conventional piezo-electric resonator for (FM), (SM) and (TM). The conventional 455 KHz resonator utilizes the fundamental mode (FM). As shown in FIG. 7, the second (SM) and third harmonic modes (TM) of the conventional resonator appear at frequencies higher than 1 MHz. Use of these second and third harmonic modes has been considered, but has not been practical because the respective resonance impedances of the harmonic modes are less than that of the fundamental mode.

SUMMARY OF THE INVENTION

The present invention has been made in view of the above circumstances and has as an object to provide a ladder type piezo-electric filter operable in a high frequency band by using a piezo-electric resonator which provides a second harmonic mode.

A further object of the present invention is to provide a ladder type piezo-electric filter with series branch piezo-electric resonators and parallel branch piezo-electric resonators manufactured at the same time using piezo-electric ceramic plates of equal thickness.

Additional objects and advantages of the invention will be set forth in part in the description which follows and, in part will be obvious from the description or may be learned by practice of the invention. The objects and advantages of the invention may be realized and attained by means of instrumentalities and combinations particularly pointed out in the appended claims.

To achieve the objects and in accordance with the purpose of the invention, as embodied and broadly described herein, the ladder type piezo-electric filter comprises a plurality N of series piezo-electric resonators, where N is an integer, comprising a piezo-electric plate having first and second sides, a central electrode provided in a central portion of the first side of the piezo-electric plate, a peripheral electrode provided on the first side of the piezo-electric plate surrounding the central electrode, and electrically insulated from the central electrode, a common electrode provided on the second side of the piezo-electric plate, the piezo-electric plate having a region corresponding to the central electrode and another region corresponding to the peripheral electrode, wherein the region and the other region have the same polarity; an input/output line electrically connecting an input terminal to a peripheral electrode of a first one of said plurality of series resonators, connecting the central electrode of an $N^{th}$ one of said plurality of series resonators to an output terminal, and connecting a central electrode of each one of said plurality of series resonators to a peripheral electrode of an adjacent one of said plurality of series resonators for each one of said plurality of series resonators 1 through N-1; a plurality N of parallel piezo-electric resonators, comprising a piezo-electric plate having first and second sides, a central electrode provided in a central portion of the first side of the piezo-electric plate, a peripheral electrode provided on the first side of the piezo-electric plate, surrounding the central electrode, and electrically connected to the central electrode, a common electrode provided on the second side of the piezo-electric plate, the piezo-electric plate having a region corresponding to the central electrode having a polarity and another region corresponding to the peripheral electrode having an opposite polarity, a ground line electrically connected to the common electrode of each one of said plurality of parallel resonators; wherein at least one of the central electrodes and the peripheral electrode for each one of said plurality of parallel resonators is electrically connected to the input/output line at a respective point between the central electrode of each one of said plurality of series resonators and the peripheral electrode of an adjacent one of said plurality of N series electrodes.

BRIEF DESCRIPTION OF THE DRAWINGS

The accompanying drawings, which are incorporated in and constitute a part of this specification, illustrate embodiments of the invention and, together with the description, serve to explain the objects, advantages and principles of the invention. In the drawings.

DESCRIPTION OF THE PREFERRED EMBODIMENTS

Figure 1A:
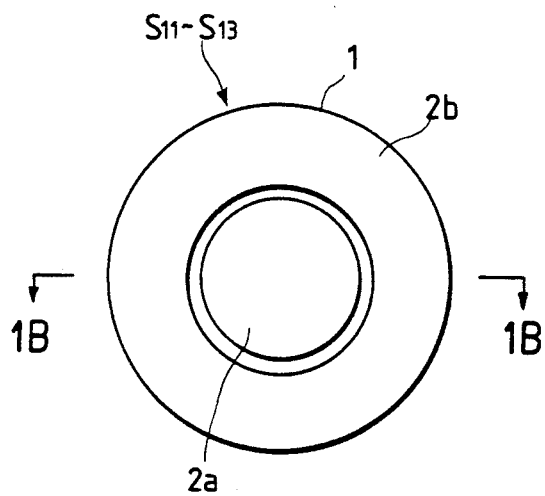
FIG. 1A is a plan view of a series branch piezo-electric resonator.
Figure 1B:
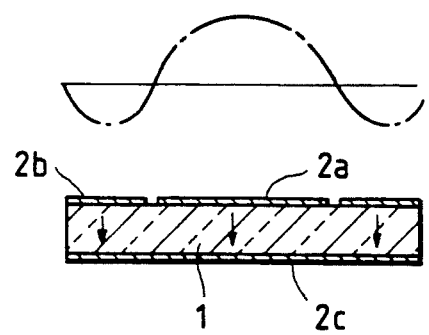
FIG. 1B is a sectional view taken along line A—A of FIG. 1A, with a waveform extended in the direction of diameter.
Figure 3:
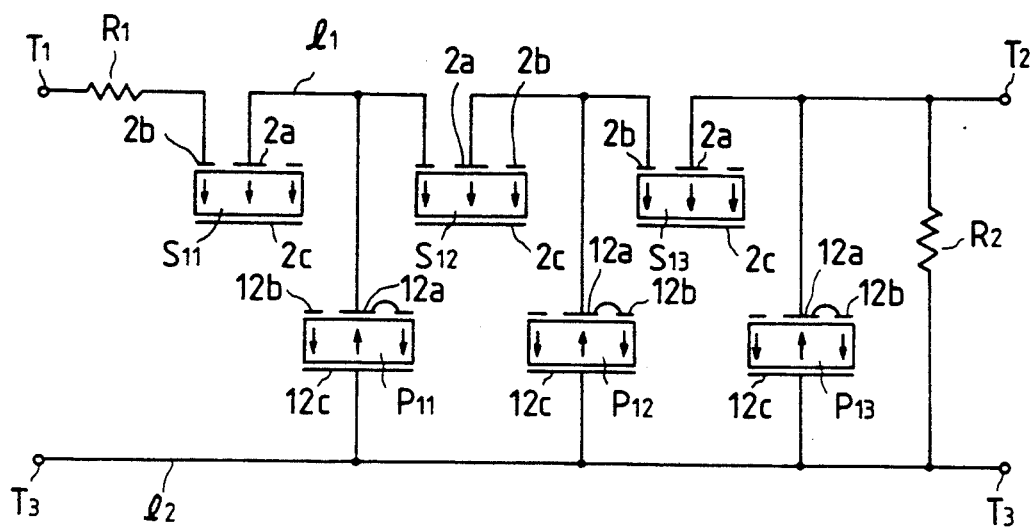
FIG. 3 is a circuit diagram showing the arrangement of a ladder type piezo-electric filter according to the invention.

FIGS. 1A and 1B show one of a series of piezo-electric resonators ($S_{11}$ through $S_{13}$) having a small capacitance and used in the respective series branches of a ladder filter circuit shown in FIG. 3. Each piezo-electric resonator $S_{11}$-$S_{13}$ comprises a piezo-electric ceramic plate 1 of predetermined thickness made of lead titanate zirconate, a central electrode 2a and an annular peripheral electrode 2b formed on one side of the piezo-electric ceramic plate 1 in such a manner that they are coaxial, and a common electrode 2c (see FIG. 1B) formed on the other side of the piezo-electric ceramic plate 1 such that it opposes electrodes 2a and 2b. Predetermined high electric fields (DC) (designated by the arrows in FIG. 1B) are applied between central electrode 2a and common electrode 2c, and between peripheral electrode 2b and common electrode 2c so as to polarize regions of the piezo-electric ceramic plate 1 corresponding to central electrode 2a and peripheral electrode 2b in the same direction.

Figure 2A:
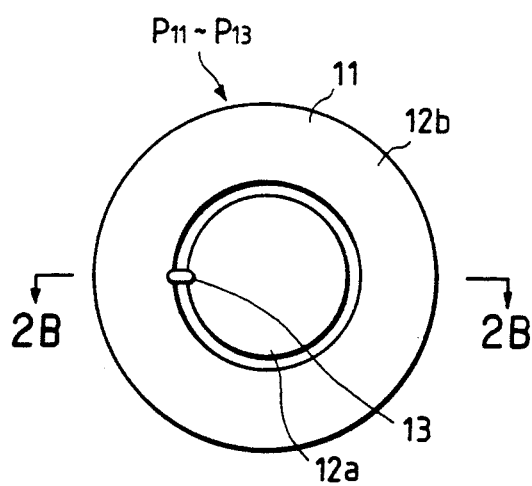
FIG. 2A is a plan view of a parallel branch piezo-electric resonator.
Figure 2B:
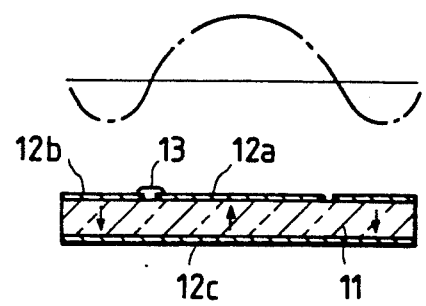
FIG. 2B is a sectional view taken along line B—B of FIG. 2A, with a waveform extended in the direction of diameter.
Figure 8:
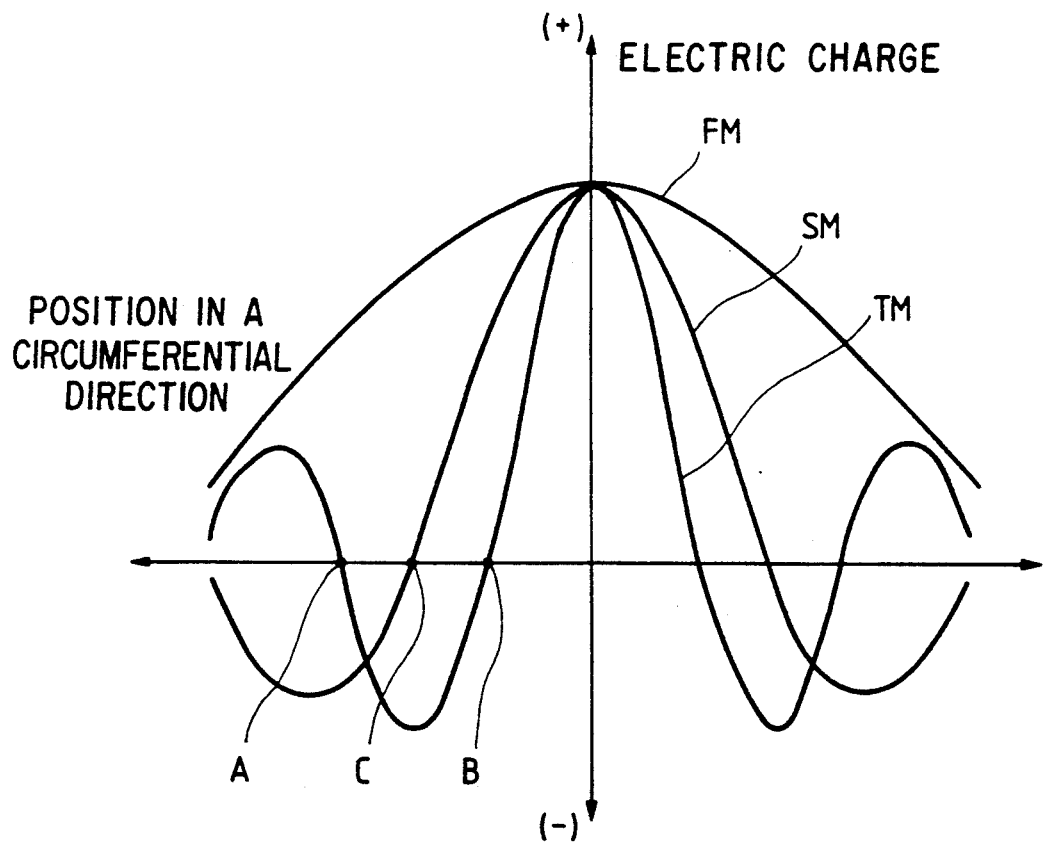
FIG. 8 is a graphical representation indicating the waveforms produced by the conventional resonator in a circumferential direction.

FIGS. 2A and 2B show one of a plurality of parallel piezo-electric resonators ($P_{11}$ through $P_{13}$) each having a large capacitance and being used in the respective parallel branches of the ladder type filter circuit shown in FIG. 3. Each of the piezo-electric resonators $P_{11}$-$P_{13}$ comprises a piezo-electric ceramic plate 11 of equal thickness to that of the abovedescribed piezo-electric ceramic plate 1, a central electrode 12a and an annular peripheral electrode 12b formed on one side of piezo-electric ceramic plate 11 in such a manner that they are coaxial, and a common electrode 12c (see FIG. 2B) formed on the other side of piezo-electric ceramic plate 11 such that it confronts central electrode 12a and peripheral electrode 12b. A predetermined high voltage is applied between central electrode 12a and common electrode 12c in the forward direction, while a predetermined high voltage is applied between peripheral electrode 12b and common electrode 12c in the opposite direction, to accordingly polarize the respective regions of piezo-electric ceramic plate 11 in opposite directions (designated by the arrows in FIG. 2B). Thereafter, central electrode 12a is electrically connected to peripheral electrode 12b with a conductive bridge 13 of solder or conductive adhesive. The respective plots above FIGS. 1B and 2B illustrate a second mode harmonic (SM) of the respective piezo-electric resonator. (Compare second mode harmonic of conventional resonator shown in FIG. 8.)

FIG. 3 shows an equivalent circuit of a ladder type filter made up of three series branch resonators, $S_{11}$ through $S_{13}$, as shown in FIG. 1, and three parallel branch resonators, $P_{11}$ through $P_{13}$, as shown in FIG. 2. Peripheral electrode 2b of series branch resonator $S_{11}$ in the first stage is connected to an input terminal $T_1$ of input/output line $l_1$, central terminal 2a of resonator $S_{11}$ is connected to peripheral electrode 2b of resonator $S_{12}$ in the second stage, central electrode 2a of resonator $S_{12}$ is connected to peripheral electrode 2b of resonator $S_{13}$ in the last stage, and central electrode 2a of resonator $S_{13}$ is connected to an output terminal $T_2$. The common electrodes 2c of the series branch resonators $S_{11}$ through $S_{13}$ are not electrically connected to input/output line $l_1$ or to ground line $l_2$, and are electrically floating.

Central electrode 12a (or alternatively the peripheral electrode 12b) of parallel branch resonator $P_{11}$ is connected to input/output line $l_1$. More specifically, it is connected between central electrode 2a of series branch resonator $S_{11}$ in the first stage and peripheral electrode 2b of the series branch resonator $S_{12}$ in the second stage. Common electrode 12c of resonator $P_{11}$ is connected to ground line $l_2$. The remaining parallel branch resonators, $P_{12}$ and $P_{13}$, are connected in a similar manner.

Figure 5:
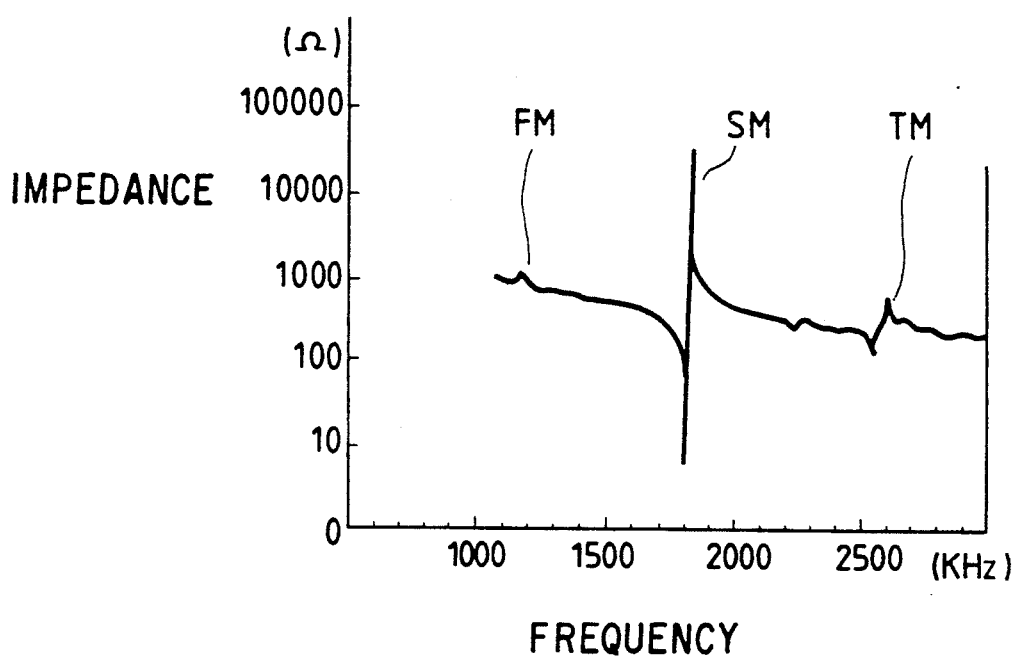
FIG. 5 is a graphical representation indicating characteristic impedance with frequency of the parallel branch piezo-electric resonator.
Figure 6:
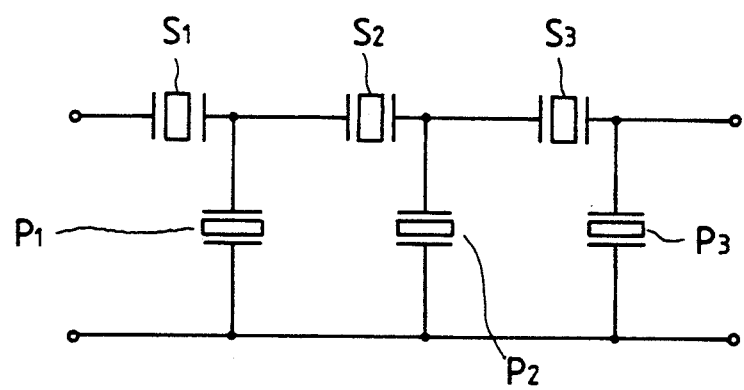
FIG. 6 is a circuit diagram showing the arrangement of a conventional ladder type piezo-electric filter.
Figure 7:
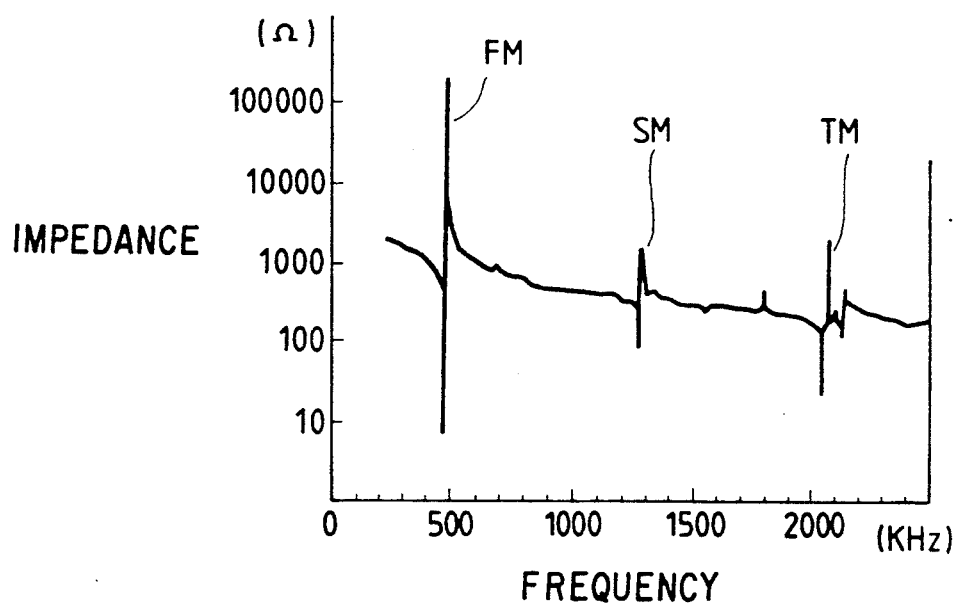
FIG. 7 is a graphical representation of characteristic impedance with frequency of a resonator in the conventional ladder type piezo-electric filter.

The series branch resonators are formed with central electrode and peripheral electrode on one side of the piezo-electric ceramic plate in such a manner that the central electrode is surrounded by, yet electrically, insulate from, the peripheral electrode. The piezo-electric ceramic plate is thus polarized in the same direction in the regions under these electrodes, and has resonance and anti-resonance impedances near 1.7 MHz for the second harmonic mode as shown in FIG. 5. FIG. 5 illustrates the response of the above-described piezo-electric ceramic plate and plots the electrical impedance ($\Omega$) as a function of resonant frequency (kHz) for a fundamental mode (FM) appearing near 1.1 MHz, a second harmonic mode (SM) and a third harmonic mode (TM).

The parallel branch resonators are also formed with central electrode and peripheral electrode on one side of the piezo-electric electric ceramic plate and also have high resonance and anti-resonance impedance near 1.7 MHz. However, central electrode and peripheral electrodes are electrically connected and regions of the piezo-electric ceramic plate under these electrodes are polarized in opposite directions as previously described.

Accordingly, a ladder type piezo-electric filter can be formed by combining the series branch resonators and the parallel branch resonators in a ladder configuration. In this type of ladder filter configuration, in order to increase the attenuation of the blocked frequency band, it is necessary to increase the ratio ($C_{01}/C_{02}$) of the capacitance $C_{01}$ of the series branch resonator to the capacitance $C_{02}$ of the parallel branch resonator. To achieve this purpose, a conventional ladder type piezo-electric filter typically increases the thickness of the series branch resonators while decreasing the thickness of the parallel branch resonators. In the ladder type piezo-electric filter of the present invention, the central electrode and the peripheral electrode of each series branch resonator are electrically insulated. Therefore, the capacitor formed by central electrode and common electrode is equivalently in series with the capacitor formed by peripheral electrode and common electrode. The electrostatic capacity $C_{01}$ of the series branch resonators is accordingly reduced.

On the other hand, the central electrode and the peripheral electrode of each parallel branch resonator are electrically connected to each other. Therefore, the capacitor formed by central electrode and common electrode is equivalently in parallel with the capacitor formed by peripheral electrode and common electrode. Accordingly, the capacitance $C_{02}$ of the parallel branch resonators is increased. As a result, the capacitance ratio ($C_{01}/C_{02}$) is increased for a ladder type piezo-electric filter having series branch resonators and the parallel branch resonators of equal thickness.

Figure 4:
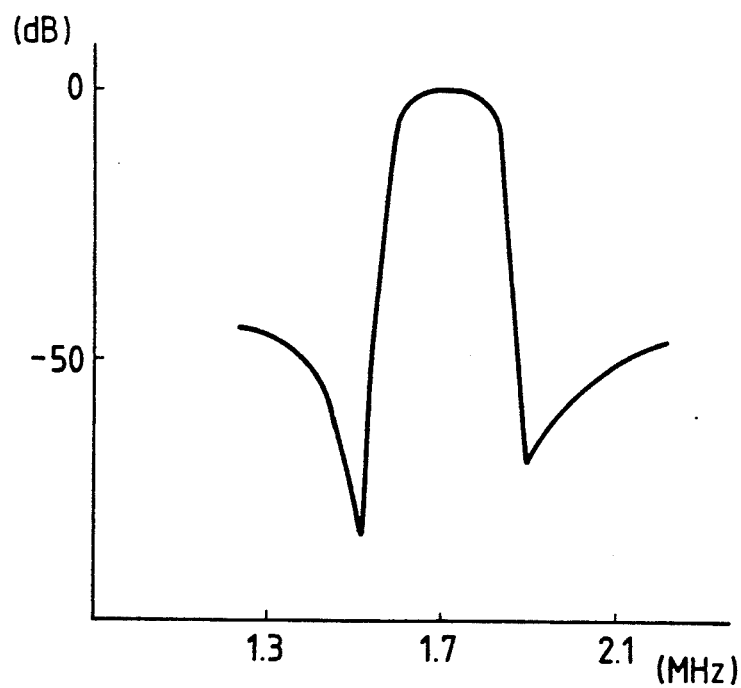
FIG. 4 is a graphical representation indicating the filtering characteristic of the ladder type piezo-electric filter according to the invention.

FIG. 4 is a graphical representation of the filtering characteristic of the filter circuit shown in FIG. 3. The filtering characteristic results illustrate typical measurements taken with input and output resistors $R_1$ and $R_2$ (1 KΩ) connected to the ladder type piezo-electric filter, the filter being made up of the following piezo-electric resonators:

(a) Series branch piezo-electric resonators:

A disk 3.75 mm in diameter and 0.5 mm in thickness formed of lead titanate ziroconate. Both sides of the disk thus formed being subjected to silver fusion to form a central electrode 2a, 1.6 mm in diameter, and an annular peripheral electrode, 0.5 mm in width, surrounding the central electrode with an insulating gap formed therebetween on one side of the disk, and common electrode 2c formed on the other side in such a manner as to cover the entirety of the other side. A DC voltage of 3 KV/mm was applied between central electrode 2a and common electrode 2c and between peripheral electrode 2b and common electrode 2c in the same direction, to polarize the disk. Thereafter, its resonance frequency is set to 1.7 MHz. The electrostatic capacity $C_{01}$ of the resonator is 50 pF.

(b) Parallel branch piezo-electric resonators:

A disk is formed from similar material and with the same dimensions as the disk of the above-described series branch piezo-electric resonator. Similarly, both sides of the disk were subjected to silver fusion so that a central electrode 12a, 1.6 mm in diameter, and an annular peripheral electrode 12b, 0.5 mm in width, surrounding central electrode 12a with an insulating gap therebetween were formed on one side of the disk, and a common electrode 12c was formed on the other side. DC voltages of 3 KV/mm were applied between central electrode 12a and common electrode 12c and between peripheral electrode 12b and common electrode 12c in the opposite directions, respectively, to polarize the disk. Thereafter, central electrode 12a is electrically connected to peripheral electrode 12b with a conductive bridge 13 laid over the insulating gap. Thereafter, the anti-resonance frequency is set to 1.7 MHz. The electrostatic capacity of the resonator is, 250 pF, although the resonator is equal in thickness to the above-described series branch piezo-electric resonator.

The ladder type piezo-electric filter thus manufactured has a filtering characteristic around 1.7 MHz as shown in FIG. 4.

In the above-described embodiment, disk-shaped piezo-electric resonators are employed. However, it should be noted that the same function and results can be obtained by using rectangular-plate-shaped piezo-electric resonators. In the above-described embodiment, three series branch piezo-electric resonators and three parallel branch piezo-electric resonators are employed. However, it should also be noted that the invention is not limited to this particular structure. The number of series branch piezo-electric resonators and the number of parallel branch piezo-electric resonators may be increased or decreased as required by design requirements. As the numbers of series branch piezo-electric resonators and parallel branch piezo-electric resonators increase, the amount of attenuation is increased. Furthermore, by making the thickness of the parallel branch piezo-electric resonators smaller than that of the series branch piezo-electric resonators, the capacity ratio ($C_{01}/C_{02}$) can further be increased, and attenuation in the blocked frequency band accordingly increased.

As described above, the ladder type piezo-electric filter of the present invention has a filtering characteristic applicable to high frequency bands, such as, for example, 1.7 MHz. Furthermore, according to the invention, the series branch piezo-electric resonators and the parallel branch piezo-electric resonators can be manufactured at the same time, or in the same process because the porcelain plates used in each resonator type have equal thickness. This fact facilitates mass production of the ladder type piezo-electric filter. As a result, a high frequency type ladder filter having filtering characteristic of 1 MHz or higher can be provided at lower manufacturing cost.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A ladder type piezo-electric filter, comprising:
   a plurality of N series piezo-electric resonators, where N is an integer, each of said plurality of series resonators including:
   a piezo-electric plate having first and second sides,
   a central electrode provided in a central portion of the first side of the piezo-electric plate,
   a peripheral electrode provided on the first side of the piezo-electric plate, surrounding the central electrode, and electrically insulated from the central electrode,
   a common electrode provided on the second side of the piezo-electric plate, and
   the piezo-electric plate having a first region corresponding to the central electrode and a second region corresponding to the peripheral electrode said first region and said second region being polarized in the same direction;
   an input/output line electrically connecting an input terminal to a peripheral electrode of a first one of said plurality of series resonators, connecting the central electrode of an $N^{th}$ one of said plurality of series resonators to an output terminal, and connecting a central electrode of each one of said plurality of series resonators to a peripheral electrode of an adjacent one of said plurality of series resonators for each one of said plurality of series resonators 1 through N;

a plurality of parallel piezo-electric resonators, each of said plurality of parallel resonators including:
a piezo-electric plate having first and second sides,
a central electrode provided in a central portion of the first side of the piezo-electric plate,
a peripheral electrode provided on the first side of the piezo-electric plate, surrounding the central electrode and electrically connected to the central electrode,
a common electrode provided on the second side of the piezo-electric plate, and
the piezo-electric plate having a first region corresponding to the central electrode, said first region being polarized in a first direction, a second region corresponding to the peripheral electrode, said second region being polarized in a direction opposite the polarization of the first region a ground line electrically connected to the common electrode of each one of said plurality of parallel resonators;

wherein the central electrode of each one of said plurality of parallel resonators is electrically connected to the input/output line at a respective point between the central electrode of each one of said plurality of series resonators and the peripheral electrode of an adjacent one of said plurality of series electrodes.

2. The ladder type piezo-electric filter according to claim 1, wherein the piezo-electric plate in each of the plurality of series resonators and the piezo-electric plate in each of the plurality of parallel resonators have equal thickness.

3. The ladder type piezo-electric filter according to claim 1, wherein the central electrode of each one of the plurality of series resonators is circularly formed about a center axis on the first side of the piezo-electric plate, and wherein the peripheral electrode of each one of the N series resonators is coaxially formed in a ring surrounding the central electrode.

4. The ladder type piezo-electric filter according to claim 1, wherein the central electrode of each one of the parallel resonators is circularly formed about a center axis on the first side of the piezo-electric plate, and wherein the peripheral electrode of each one of the plurality of parallel resonators is coaxially formed in a ring surrounding the central electrode.

5. The ladder type piezo-electric filter according to claim 1, wherein the central electrode of each one of the series and parallel resonators is respectively formed about a respective center axis on the first side of each respective piezo-electric plate, and wherein the peripheral electrode of each one of the series and parallel resonators is coaxially formed in a ring surrounding the respective central electrode.

6. The ladder type piezo-electric filter according to claim 1, wherein the piezo-electric plate in each one of the plurality of series and parallel resonators is a ceramic.

* * * * *